(12) United States Patent
Chiu et al.

(10) Patent No.: US 8,325,288 B2
(45) Date of Patent: Dec. 4, 2012

(54) DISPLAY PANEL HAVING REPAIR STRUCTURE AND METHOD OF REPAIRING DISPLAY PANEL

(75) Inventors: Chuei-Lin Chiu, Taoyuan (TW);
Chi-Chao Liu, Yunlin County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 483 days.

(21) Appl. No.: 12/544,198

(22) Filed: Aug. 19, 2009

(65) Prior Publication Data
US 2010/0265424 A1 Oct. 21, 2010

(30) Foreign Application Priority Data

Apr. 17, 2009 (TW) .............................. 98112822 A

(51) Int. Cl.
*G02F 1/1333* (2006.01)
(52) U.S. Cl. .......................... 349/54; 349/192
(58) Field of Classification Search .............. 349/54–55, 349/192; 257/E21.596; 345/91
See application file for complete search history.

(56) References Cited

U.S. PATENT DOCUMENTS

| 6,555,876 B2 * | 4/2003 | Jun et al. ...................... 257/350 |
| 7,193,664 B2 * | 3/2007 | Liu et al. ......................... 349/54 |
| 2006/0077313 A1 | 4/2006 | Liu | |

FOREIGN PATENT DOCUMENTS

| CN | 1916745 A | 2/2007 |
| KR | 1020070036915 | 4/2007 |
| TW | 533600 | 5/2003 |

* cited by examiner

*Primary Examiner* — Uyen Chau N Le
*Assistant Examiner* — Michael Mooney
(74) *Attorney, Agent, or Firm* — Winston Hsu; Scott Margo

(57) ABSTRACT

A display panel having a repair structure utilizes floating repair lines integrated into the display panel. Each of the floating repair lines bridges across each of any two adjacent pixels so as to be used for the repair of open lines on scan lines, data lines and common lines in the display panel as required. The display panel of the present invention having a repair structure integrates each of the floating repair lines between each of any two adjacent pixels so as to form new substitutional signal transmission routes of various types of open lines. The substitutional signal transmission route is able to reduce the resistive-capacitive delay of the repaired display panel and the impedance of repaired lines, and avoid signal decay and distortion.

5 Claims, 16 Drawing Sheets

DISPLAY PANEL HAVING REPAIR STRUCTURE AND METHOD OF REPAIRING DISPLAY PANEL

BACKGROUND OF THE INVENTION

1. Field of the Invention

The present invention relates to a display panel having a repair structure and a method of repairing a display panel, and more particularly, to a display panel having a repair structure with floating repair lines, and a method of repairing the display panel. In the display panel, the repair structure can be utilized to selectively repair broken scan lines, broken data lines and broken common lines.

2. Description of the Prior Art

In the conventional manufacturing process of the display panel, the appearance of the broken data lines may result from process variation, mindless operation or other unexpected factors. The broken data lines generates open signals, which results in malfunction of the thin film transistor switches or storage capacitors, thereby seriously influencing the image quality of the display panel. With reference to FIG. 1, FIG. 1 is a schematic diagram illustrating a method of repairing the data lines of a conventional liquid crystal display (LCD) panel. As illustrated in FIG. 1, the conventional LCD panel 10 includes a substrate 12, a data line driving circuit board 14, a scan line driving circuit board 16, an active region 18, a plurality of external repair lines $R_1 \sim R_N$, a plurality of scan lines $S_1 \sim S_N$ and a plurality of data lines $D_1 \sim D_N$ disposed on the substrate 12. The scan lines $S_1 \sim S_N$ and the data lines $D_1 \sim D_N$ are perpendicular to each other, and the external repair lines $R_1 \sim R_N$ and each of the data lines $D_1 \sim D_N$ have overlapping projection areas in the vertical projection direction. According to the conventional repairing method, when a defect position A appears in the data line $D_N$, a welding process should be performed so that the overlapping positions B, C of the external repair line $R_1$ and the data line $D_N$ in the vertical projection direction are welded. After that, the data line $D_N$ originally having the defect position A is electrically connected the external repair line $R_1$ so that data line signals sending from the data line driving circuit board 14 can be delivered through the external repair line $R_1$ between the overlapping position B and the overlapping position C, which serves as a new data signal transmission route, to the data line $D_N$ opposite to the defect position A. However, because the conventional external repair lines $R_1 \sim R_N$ are disposed on the periphery of the active region 18, the lengths of the signal transmission routes are longer. In another aspect, with the tread for forming larger-size display panel, both the phenomena of signal delay and the problem of signal distortion appearing in the display panel after repairing become serious, which degrades the electrical performance of the display panel.

SUMMARY OF THE INVENTION

One object of the present invention is to provide a display panel having a repair structure and a method of repairing a display panel so that the disconnected scan lines, the disconnected data lines and the disconnected common lines in the display panel can be repaired as required.

In order to achieve the above-mentioned object, the present invention proposes a display panel having a repair structure of the present invention. The display panel having a repair structure of the present invention includes a substrate, a first metal layer disposed on the substrate, an insulating layer covering the first metal layer disposed on the substrate, a second metal layer disposed on the insulating layer. The first metal layer includes a first scan line, a second scan line, a third scan line and a plurality of common lines. The common lines include a first common line and a second common line. The second metal layer includes a first data line, a second data line, a third data line and a first repair line. The first data line, the second data line and the third data line are substantially parallel to each other and perpendicular to the first scan line, the second scan line and the third scan line for defining a plurality of pixel regions arranged in an array-shaped arrangement. The pixel regions include a first pixel region, a second pixel region, a third pixel region and a fourth pixel region. The first common line penetrates through the first pixel region and the second pixel region and partially overlaps with the first data line, the second data line and the third data line, the second common line penetrates through the third pixel region and the fourth pixel region and partially overlaps with the first data line, the second data line and the third data line, the first repair line bridges across the first pixel region and the third pixel region and partially overlaps with the second scan line, and the first repair line partially overlaps with the first common line disposed in the first pixel region and partially overlaps with the second common line disposed in the third pixel region respectively.

In order to achieve the above-mentioned object, the present invention proposes a method of repairing a display panel. The method of repairing a display panel includes the following steps. A display panel is provided. The display panel includes a substrate, a first metal layer disposed on the substrate, an insulating layer covering the first metal layer disposed on the substrate, and a second metal layer disposed on the insulating layer. The first metal layer includes a first scan line, a second scan line, a third scan line, a first common line and a second common line. The second metal layer includes a first data line, a second data line, a third data line and a first repair line. The first data line, the second data line and the third data line are arranged substantially parallel to each other and substantially perpendicular to the first scan line, the second scan line and the third scan line for defining a first pixel region, a second pixel region, a third pixel region and a fourth pixel region arranged in an array-shaped arrangement. The first common line penetrates through the first pixel region and the second pixel region and partially overlaps with the first data line, the second data line and the third data line, the second common line penetrates through the third pixel region and the fourth pixel region and partially overlaps with the first data line, the second data line and the third data line. The first repair line bridges across the first pixel region and the third pixel region and partially overlaps with the second scan line, and the first repair line partially overlaps with the first common line disposed in the first pixel region and the second common line disposed in the third pixel region respectively. Then, the first repair line is utilized to perform a repair process upon the display panel to repair a disconnected line of the display panel.

The display panel having a repair structure of present invention integrates the floating repair lines into the display panel so that the floating repair lines can repair the disconnected scan lines, the disconnected data lines and the disconnected common lines appearing inside the display panel. The method of repairing a display panel of the present invention not only overcomes the obstacle of the conventional display panel repair line technique which can only repair the disconnected data lines with defects, but also solves the inevitable signal delay phenomena of the conventional display panel technique using external repair line. Moreover, the disadvantages such as electrical instability can be eliminated. In addition, the problem of electrical instability such as signal decay and signal distortion caused due to higher impedance of the repair lines is also addressed.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, manufacturers may refer to a component by different names. This document does not intend to distinguish between components that differ in name but in function. In the following discussion and in the claims, the terms "include" and "comprise" are used in an open-ended fashion, and thus should be interpreted to mean "including, but not limited to . . . ". In addition, the term "electrically connected" includes any directly or indirectly electrical connection methods. Therefore, if the description in the following paragraphs is that a first device is electrically connected to a second device, the aforementioned words stand for that the first device can be electrically connected to the second device directly or be electrically connected to the second device indirectly by means of other devices or electrical connection methods.

Figure 1:
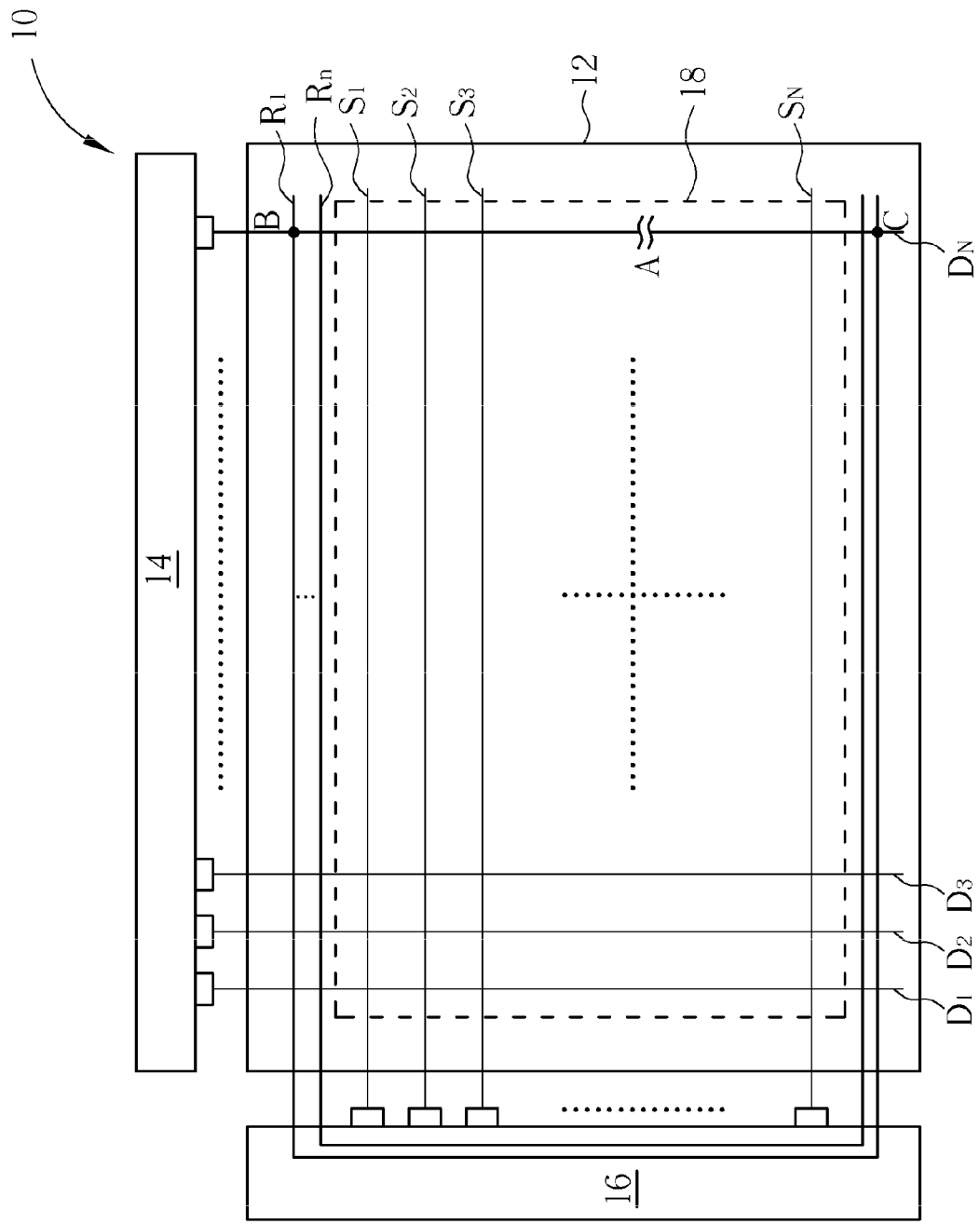
FIG. 1 is a schematic diagram illustrating a method of repairing the data lines of a conventional liquid crystal display panel.
Figure 2:
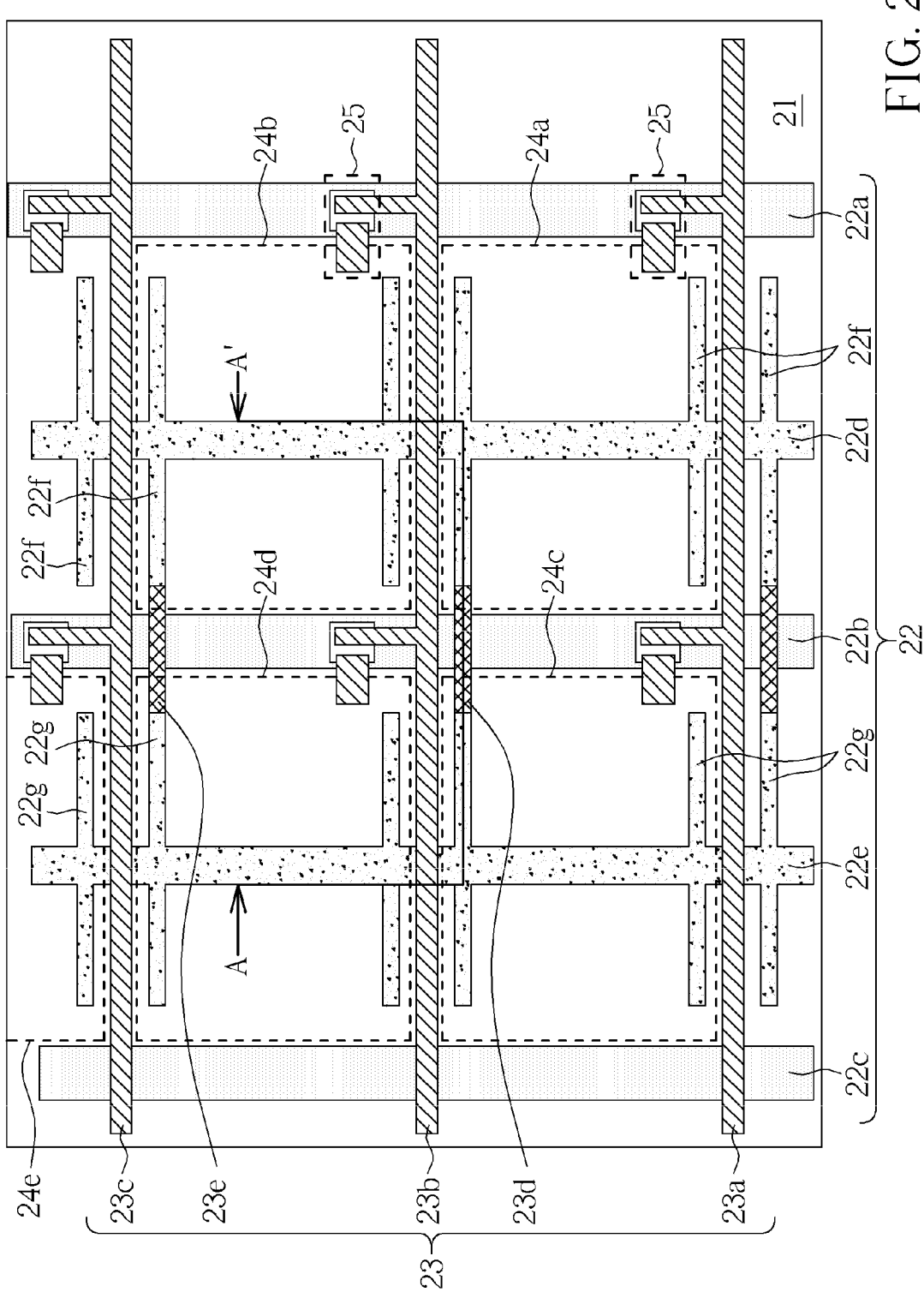
FIG. 2 is a schematic diagram illustrating a first preferred embodiment of the display panel having a repair structure of the present invention.
Figure 3:
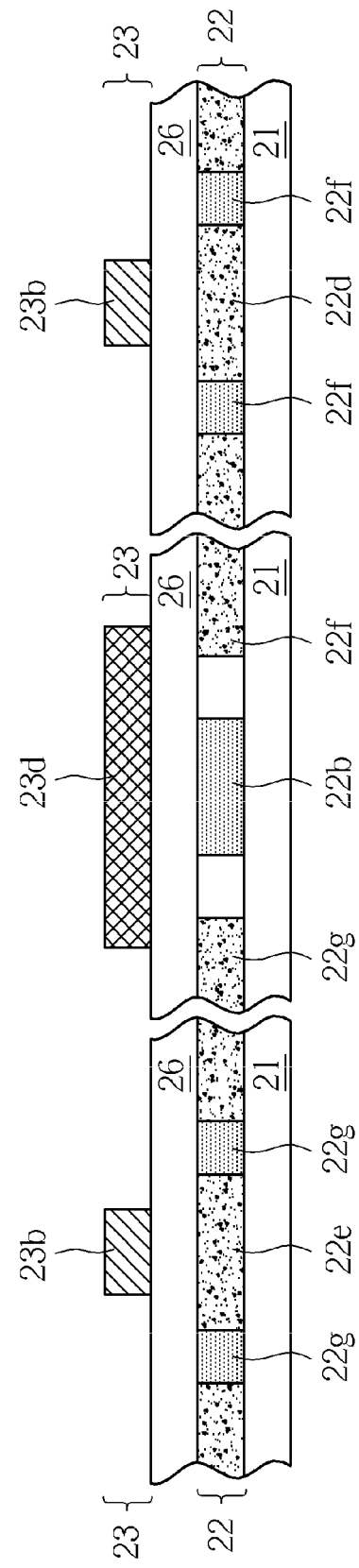
FIG. 3 is a schematic diagram illustrating a cross-sectional structure along line AA' illustrated in FIG. 2.

With reference to FIG. 2 and FIG. 3, FIG. 2 is a schematic diagram illustrating a first preferred embodiment of the display panel having a repair structure of the present invention, and FIG. 3 is a schematic diagram illustrating a cross-sectional structure along line AA' illustrated in FIG. 2. As illustrated in FIG. 2 and FIG. 3, in order to clearly describe the structure of the present invention, FIG. 2 and FIG. 3 are referred and explained together. The display panel having a repair structure of the first preferred embodiment of the present invention includes a substrate 21, a first metal layer 22 disposed on the substrate 21, an insulating layer 26 covering the first metal layer 22 disposed on the substrate 21, a second metal layer 23 disposed on the insulating layer 26. The first metal layer 22 includes a first scan line 22a, a second scan line 22b, a third scan line 22c and a plurality of common lines, and each of the common lines further includes a plurality of common line branches. In this embodiment, the common lines include a first common line 22d and a second common line 22e, the first common line 22d includes a plurality of first common line branches 22f, and the second common line 22e includes a plurality of second common line branches 22g. The first common line 22d is electrically connected to the first common line branches 22f, and the second common line 22e is electrically connected to the second common line branches 22g. Each of the common lines penetrates through the central parts of pixel regions so that the common lines and common line branches substantially form an H-shaped structure in each of the pixel regions. In addition, the second metal layer 23 includes a first data line 23a, a second data line 23b, a third data line 23c, a first floating repair line 23d and a second floating repair line 23e. The first data line 23a, the second data line 23b and the third data line 23c are arranged substantially parallel to each other and substantially perpendicular to the first scan line 22a, the second scan line 22b and the third scan line 22c respectively so that a first pixel region 24a, a second pixel region 24b, a third pixel region 24c, a fourth pixel region 24d and a fifth pixel region 24e are defined and in an array-shaped arrangement. Each of the pixel regions respectively includes a thin film transistor switch 25 disposed on the same side of each of the scan lines to form a 4-domain pixel electrode arrangement. In addition, the first common line 22d penetrates through the first pixel region 24a and the second pixel region 24b, and the second common line 22e penetrates through the third pixel region 24c and the fourth pixel region 24d. The first common line 22d and the second common line 22e have overlapping projection areas respectively with the first data line 23a, the second data line 23b and the third data line 23c in the vertical projection direction. The cross-sectional structure in the vertical projection direction illustrated in FIG. 3 can be referred to further comprehend that the first common line 22d, the second common line 22e, and the second data line 23b substantially have an insulating layer 26 disposed therebetween, and the second common line 22e and the second data line 23b substantially have an insulating layer 26 disposed therebetween. Besides, the first floating repair line 23d brides across the first pixel region 24a and the third pixel region 24c, the first common line branches 22f are disposed in the first pixel region 24a, and the second common line branches 22g are disposed in the third pixel region 24c. The cross-sectional structure in the vertical projection direction illustrated in FIG. 3 can be referred to further comprehend that an insulating layer 26 is substantially disposed between the first repair line 23d and the second scan line 22b, and the first floating repair line 23d has an overlapping projection area respectively with the first common line branch 22f and the second common line branch 22g in the vertical projection direction. Similarly, as illustrated in FIG. 2, the second floating repair line 23e bridges across the second pixel region 24b and the fourth pixel region 24d and has an overlapping projection area with the second scan line 22b in the vertical projection direction, the second floating repair line 23e and the first common line branch 22f disposed in the second pixel region 24b has an overlapping projection area in the vertical projection direction, and similarly the second floating repair line 23e and the second common line branch 22g disposed in the fourth pixel region 24d has an overlapping projection area in the vertical projection direction.

Figure 4:
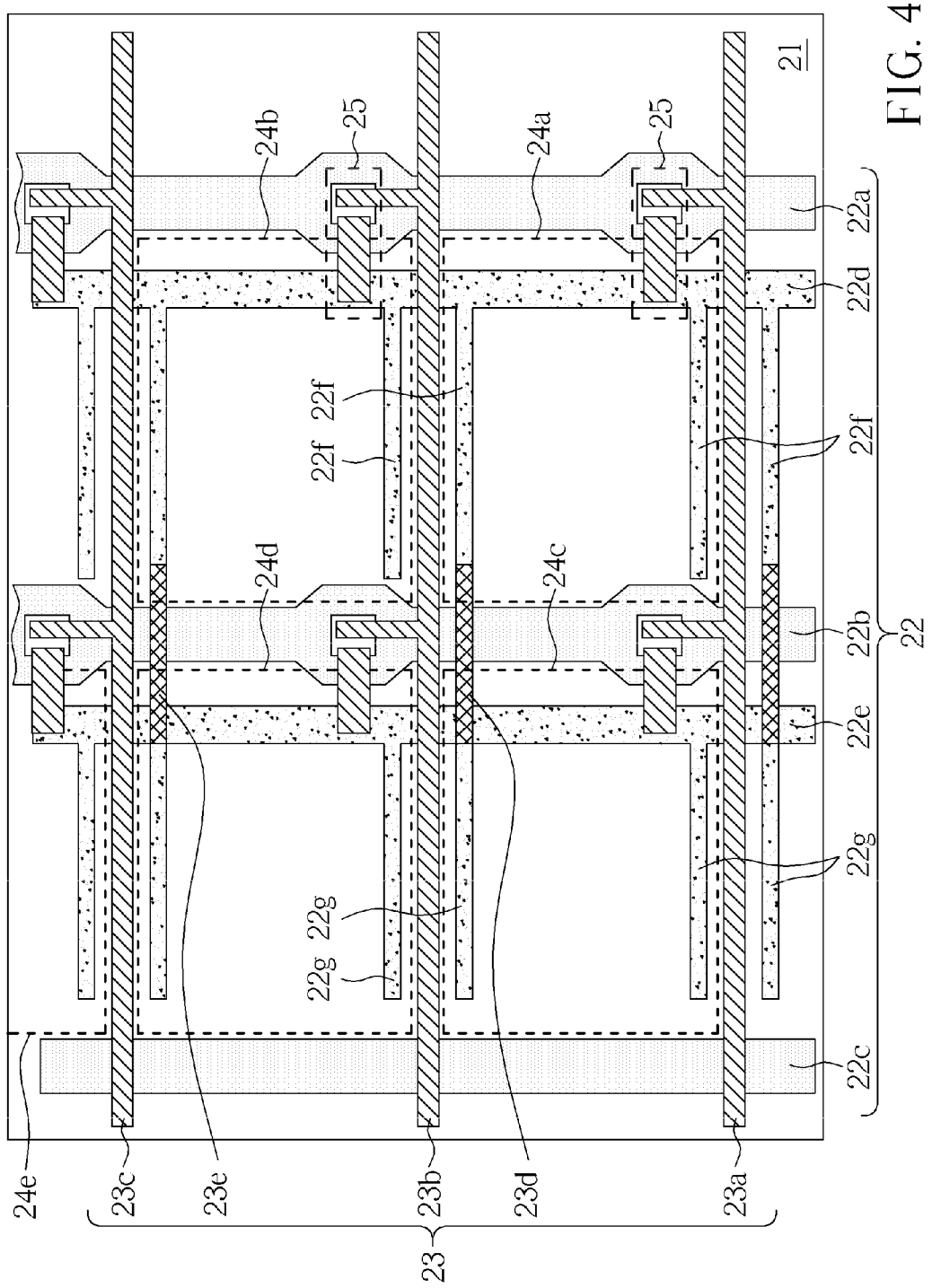
FIG. 4 is a schematic diagram illustrating a second preferred embodiment of the display panel having a repair structure of the present invention.
Figure 5:
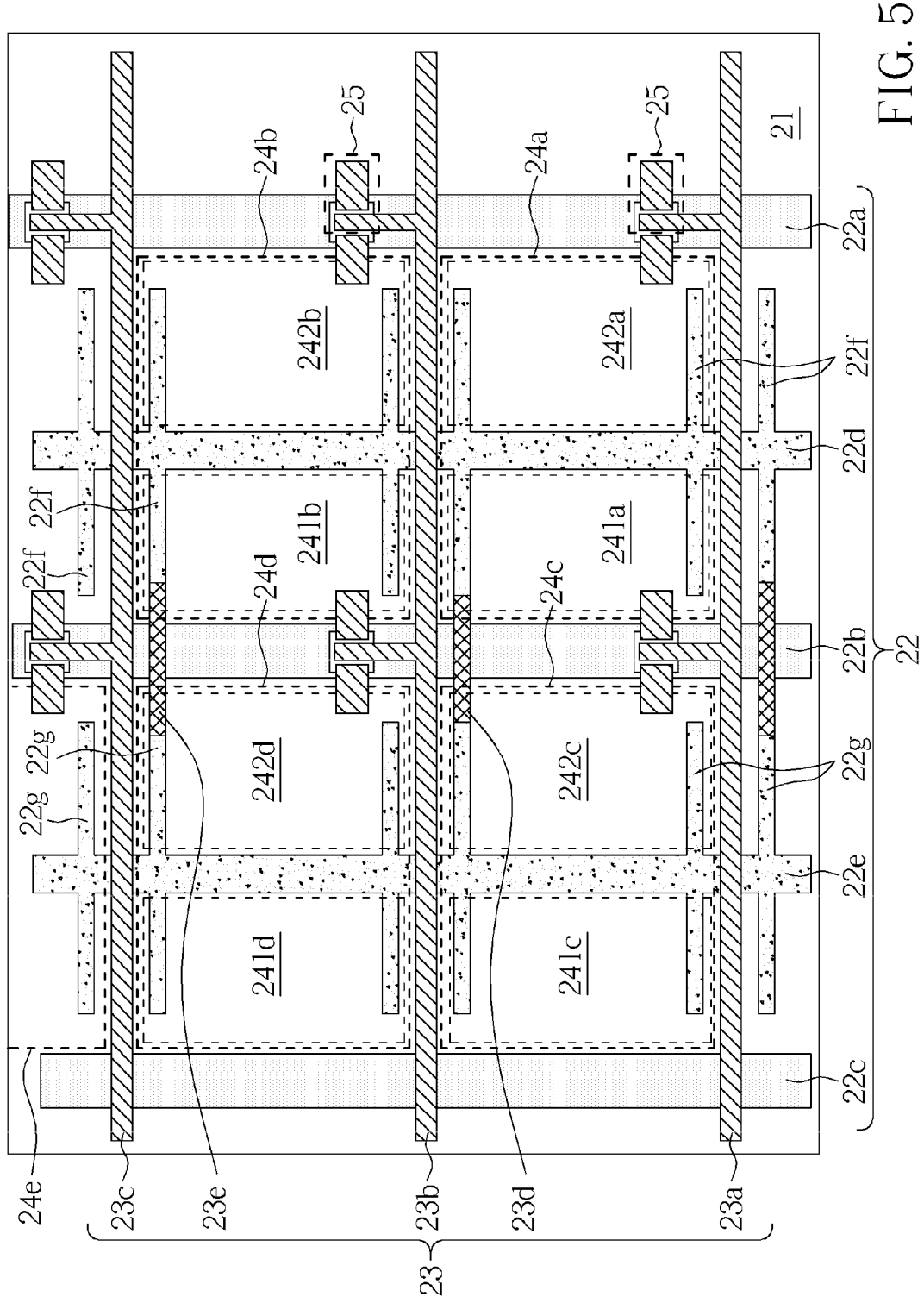
FIG. 5 is a schematic diagram illustrating a third preferred embodiment of the display panel having a repair structure of the present invention.

With reference to FIG. 4, FIG. 4 is a schematic diagram illustrating a second preferred embodiment of the display panel having a repair structure of the present invention. As illustrated in FIG. 4 and FIG. 2, the difference between the first and second preferred embodiments of the display panels having repair structures is that the first common line 22d and the second common line 22e of two embodiments are disposed in different positions in the pixel regions. In the second preferred embodiment, each of the common lines penetrates through edge parts of the pixel regions, and the common lines and the common line branches disposed in each of the pixel region substantially form a U-shaped structure. With reference to FIG. 5, FIG. 5 is a schematic diagram illustrating a third preferred embodiment of the display panel having a repair structure of the present invention. As illustrated in FIG. 5 and FIG. 2, the difference between the third and first preferred embodiments of the display panels having repair structures is that the third preferred embodiment of the display panel is disposed in an 8-domain pixel electrode arrangement. Thus, thin film transistor switches 25 are additionally disposed on another side of each of the scan lines in the pixel regions, and each of the pixel regions includes two sub-pixel regions. For example, the first pixel region 24a includes two sub-pixel regions 241a, 242a; the second pixel region 24b includes two sub-pixel regions 241b, 242b; the third pixel region 24c includes two sub-pixel regions 241c, 242c; and the fourth pixel region 24d includes two sub-pixel regions 241d, 242d. In this embodiment, the repair structure is similar to the aforementioned first and second preferred embodiments.

Figure 6:
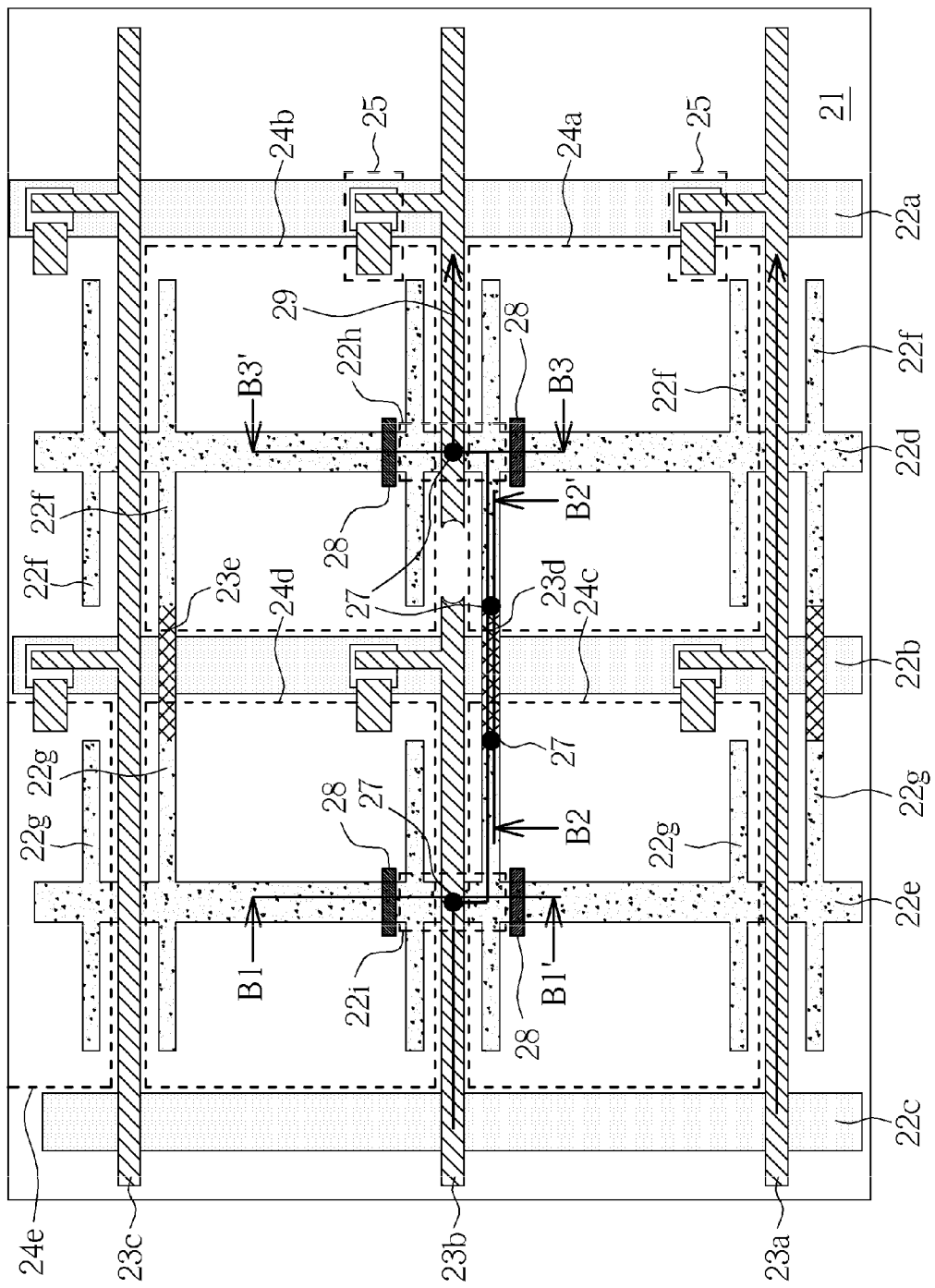
FIG. 6 is a top view diagram illustrating a method of repairing the disconnected data lines of the first preferred embodiment of the display panel having a repair structure of the present invention.
Figure 7:
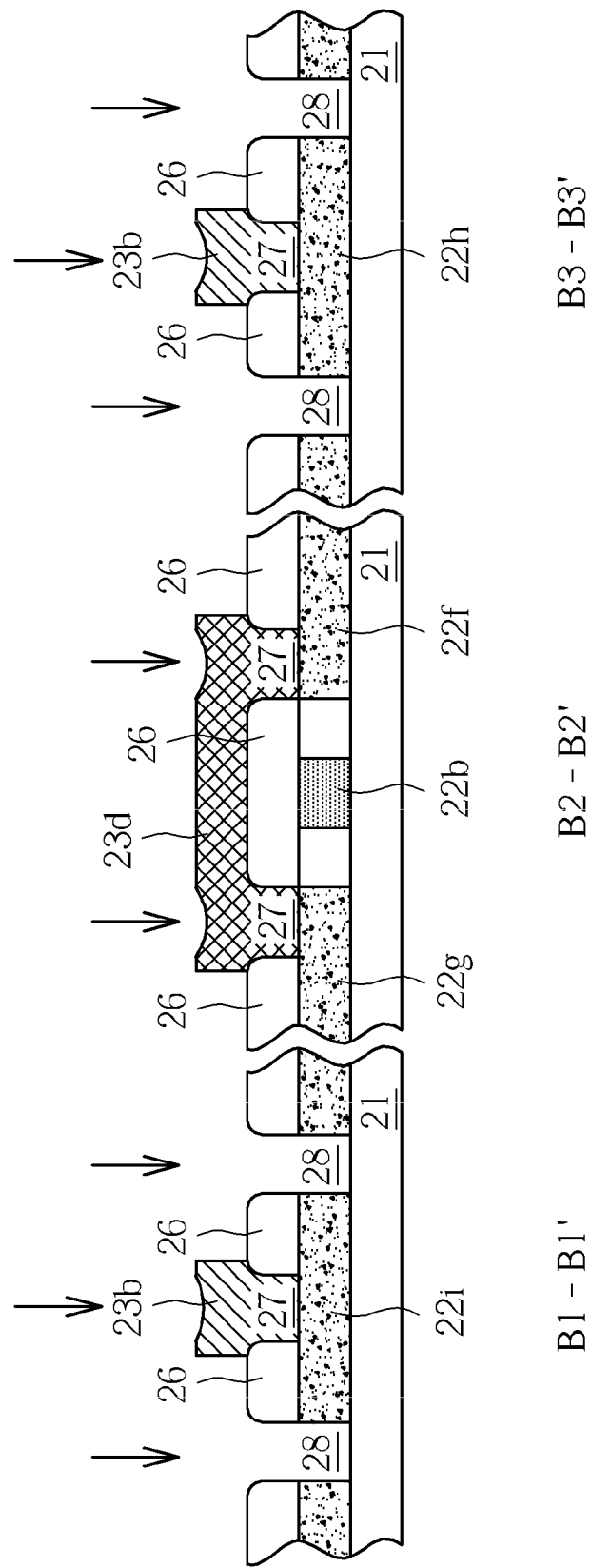
FIG. 7 is a cross-sectional schematic diagram along the lines B1B1', B2B2', B3B3' illustrated in FIG. 6.
Figure 8:
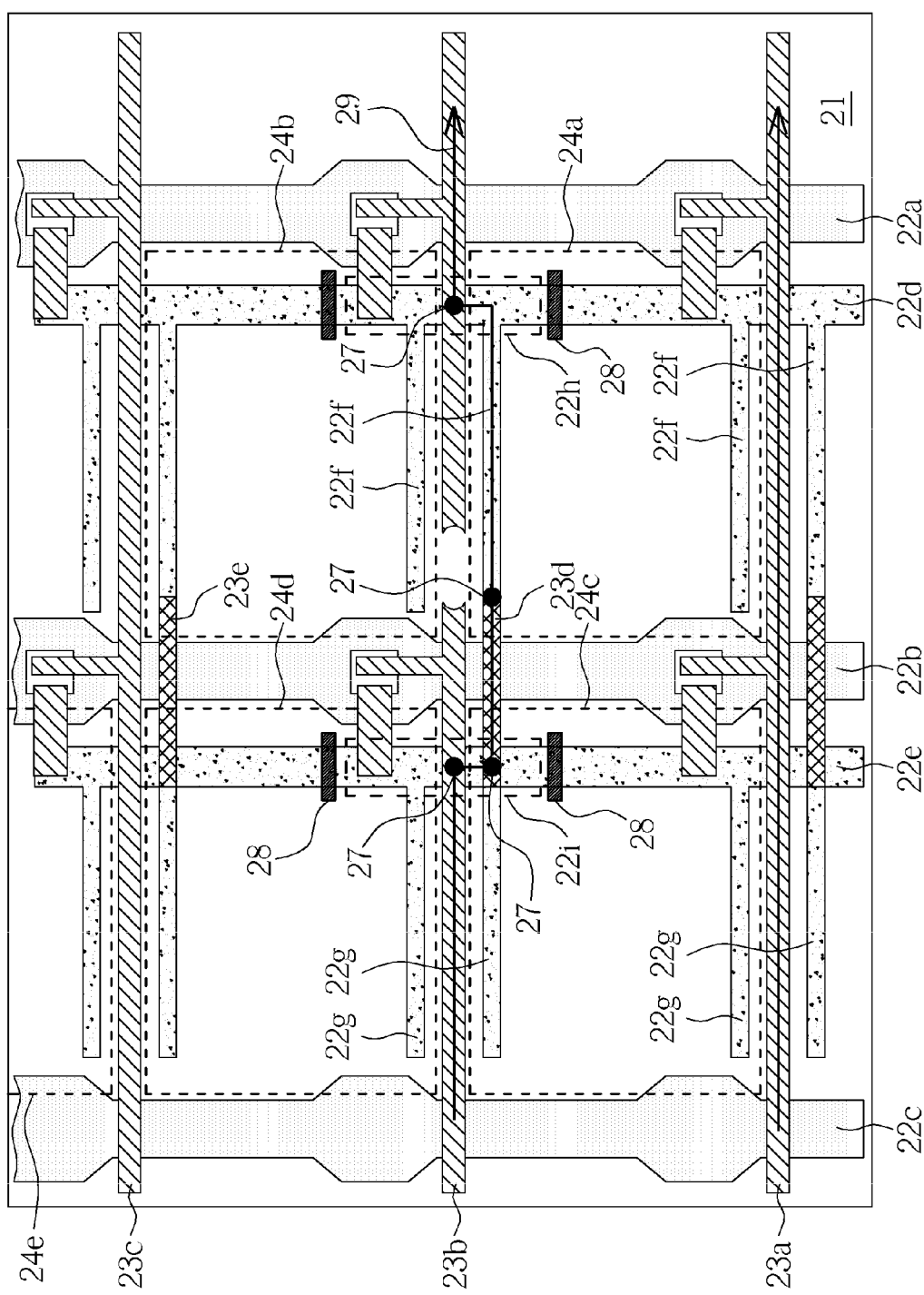
FIG. 8 is a schematic diagram illustrating a method of repairing the disconnected data lines of the second preferred embodiment of the display panel having a repair structure of the present invention.
Figure 9:
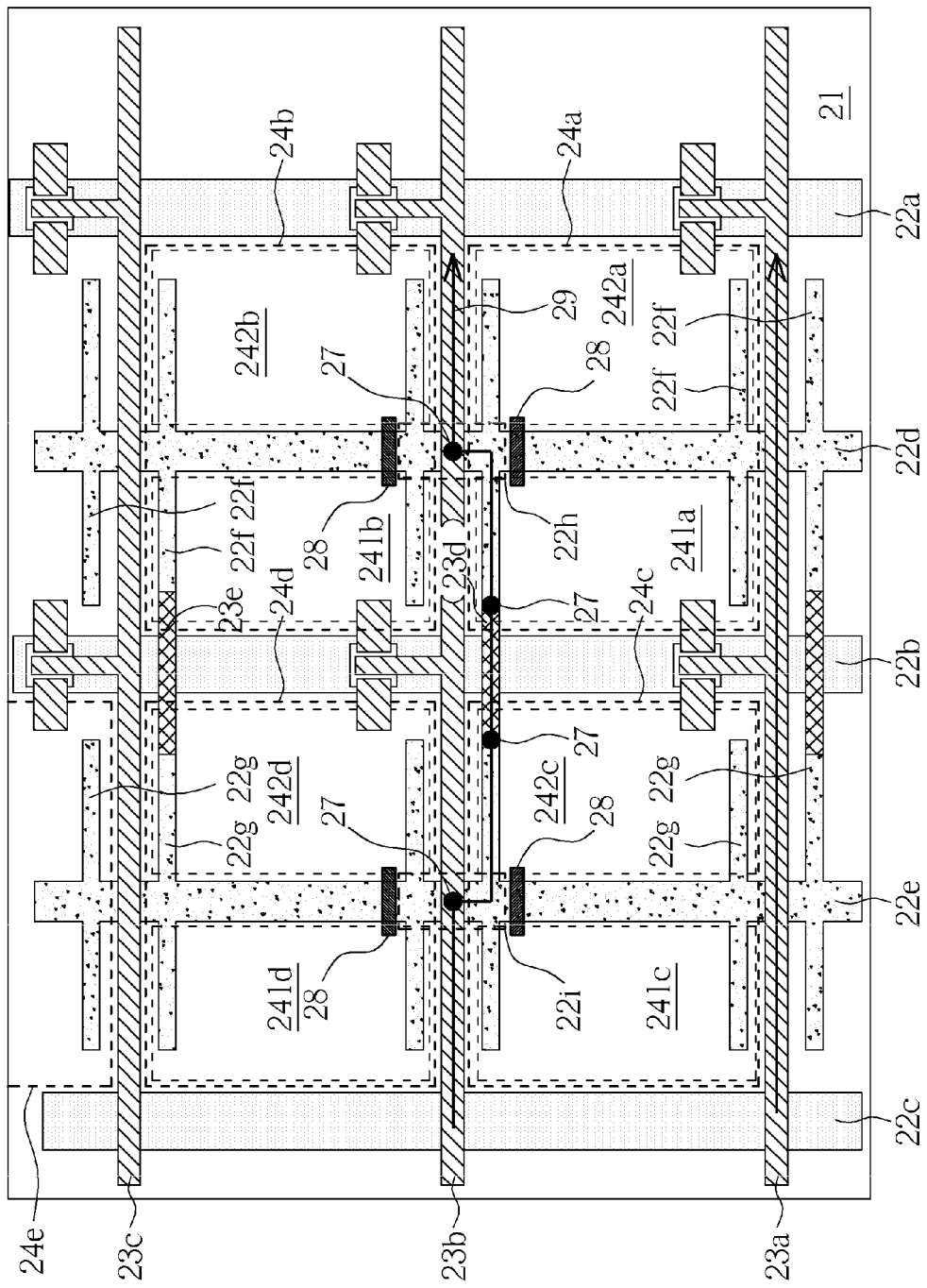
FIG. 9 is a schematic diagram illustrating a method of repairing the disconnected data lines of the third preferred embodiment of the display panel having a repair structure of the present invention.

With reference to FIG. 6 and FIG. 7, FIG. 6 and FIG. 7 are schematic diagrams illustrating a method of repairing the disconnected data lines of the first preferred embodiment of the display panel having a repair structure of the present invention, FIG. 6 is a top view diagram, and FIG. 7 is a cross-sectional schematic diagram along the lines B1B1', B2B2', B3B3' illustrated in FIG. 6. The method illustrated in FIG. 6 and FIG. 7 is carried out to repair the disconnected data lines of the display panel having a repair structure illustrated in FIG. 2. As illustrated in FIG. 6 and FIG. 7, the steps of repairing the disconnected data lines include performing a welding process and performing a cutting process. For example, if the disconnected line occurs to the second data line 23b between the first pixel region 24a and the third pixel region 24c, the following steps are performed to repair the disconnected data lines. A welding process such as laser welding process is performed so as to form a plurality of welding structures 27, and each of the welding structures 27 is served as a connector to electrically connect one terminal of the first floating repair line 23d and the first common line branch 22f and to electrically connect another terminal of the first repairing line 23d and the second common line branch 22g. A cutting process such as laser cutting process is performed to form a plurality of cutting openings 28. Parts of the cutting openings 28 disconnect the first common line 22d disposed in the first pixel region 24a and the second pixel region 24b. Accordingly, the disconnected first common line 22d forms a first floating common line 22h. Also, parts of the cutting openings 28 disconnect the second common lines 22e disposed in the third pixel region 24c and the fourth pixel region 24d so that the disconnected second common line 22e forms a second floating common line 22i. As illustrated in FIG. 7, the two terminals of the first floating repair line 23d are vertically welded to the first common line branch 22f and the second common line branch 22g respectively by virtue of laser irradiation so as to form a new signal transmission route. In addition, the two opposite terminals of the first common line 22d and those of the second common line 22e are cut in the vertical projection direction respectively by virtue of laser irradiation to form a first floating common line 22h and a second floating common line 22i. Thus, as illustrated in FIG. 6, the second floating common line 22i, the first floating repair line 23d and the first floating common line 22h accordingly form one substitutional signal transmission route 29 for the second data line 23b so as to achieve the goal of repairing the disconnected data line. It should be noted that the sequence of the steps of the aforementioned welding process and cutting process can be adjusted as required and have no particular limitation. With reference to FIG. 8 and FIG. 9, FIG. 8 is a schematic diagram illustrating a method of repairing the disconnected data lines of the second preferred embodiment of the display panel having a repair structure of the present invention, and FIG. 9 is a schematic diagram illustrating a method of repairing the disconnected data lines of the third preferred embodiment of the display panel having a repair structure of the present invention. The method illustrated in FIG. 8 is carried out to repair the disconnected data line of the display panel having a repair structure illustrated in FIG. 4, and the method illustrated in FIG. 9 is carried out to repair the disconnected data line of the display panel having a repair structure illustrated in FIG. 5. As illustrated in FIG. 8 and FIG. 9, the methods of repairing data lines according to the aforementioned two preferred embodiments include performing a welding process such as laser welding process and performing a cutting process such as laser cutting process so that a substitutional signal transmission route 29 is formed for the second data line 23b. As illustrated in FIG. 8 and FIG. 6, the difference between the methods of repairing the disconnected data lines of the first and second preferred embodiment of the display panel pixel having repair structures is that the two preferred embodiments originally have different pixel electrode arrangements so that the cutting positions of the common lines in the pixel regions are substantially different while laser irradiation is applied. As illustrated in FIG. 9 and FIG. 6, the difference between the methods of repairing the disconnected data lines of the third and first preferred embodiments of the display panel pixel having repair structures is that an 8-domain pixel electrode arrangement is adapted in the third preferred embodiment for repairing of the disconnected data lines, whereas the method of repairing disconnected data lines of the third preferred embodiment is substantially identical to the methods of repairing disconnected lines of the aforementioned first and second preferred embodiments.

Figure 10:
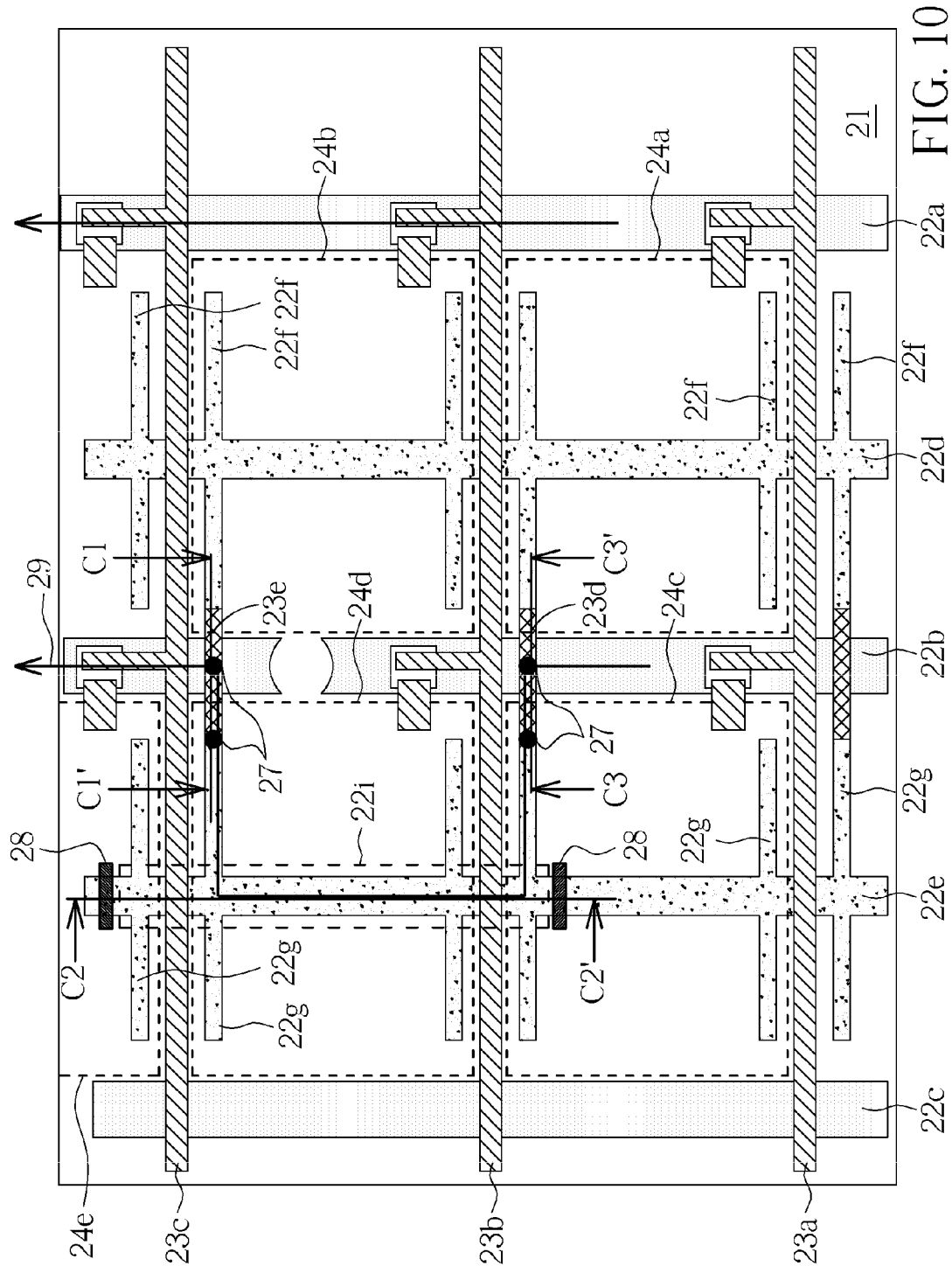
FIG. 10 is a top view diagram illustrating a method of repairing the disconnected lines of the first preferred embodiment of the display panel having a repair structure of the present invention.
Figure 11:
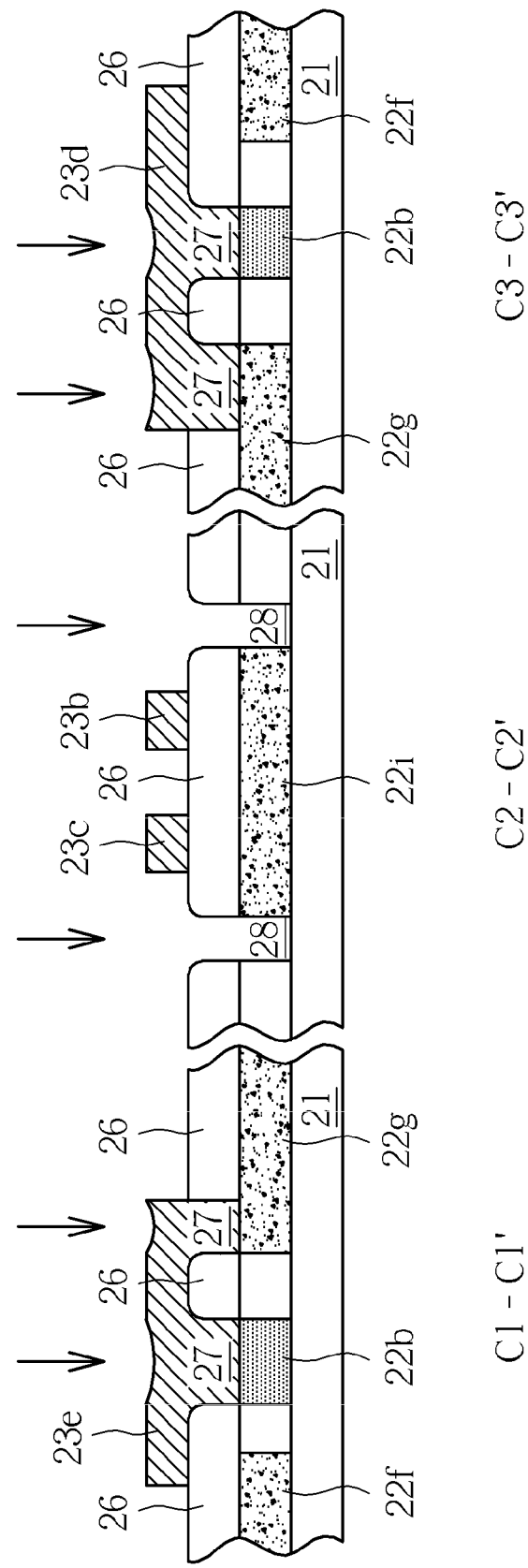
FIG. 11 is a cross-sectional schematic diagram along the lines C1C1', C2C2', C3C3' illustrated in FIG. 10.
Figure 12:
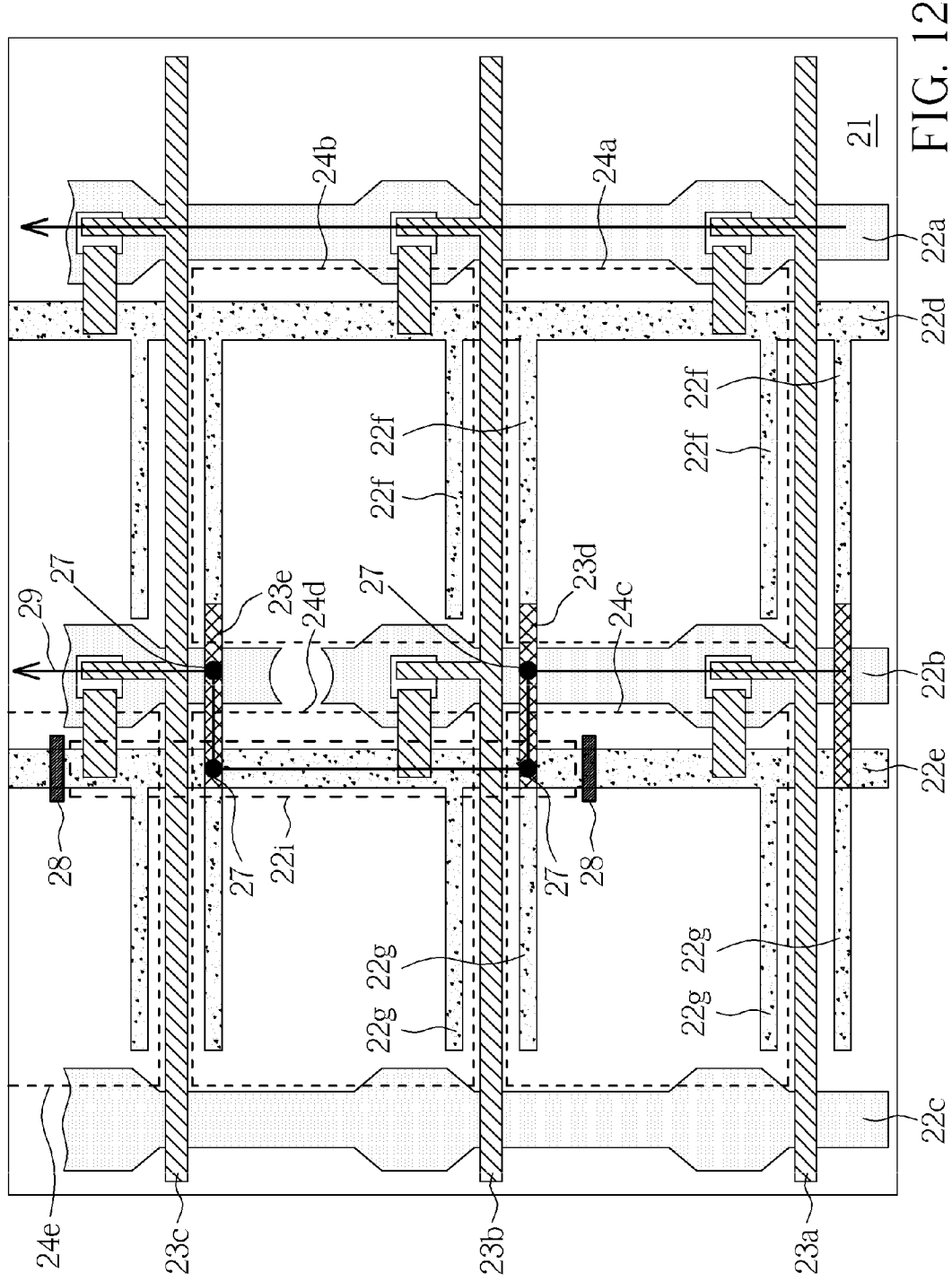
FIG. 12 is a schematic diagram illustrating a method of repairing the disconnected scan lines of the second preferred embodiment of the display panel having a repair structure of the present invention.
Figure 13:
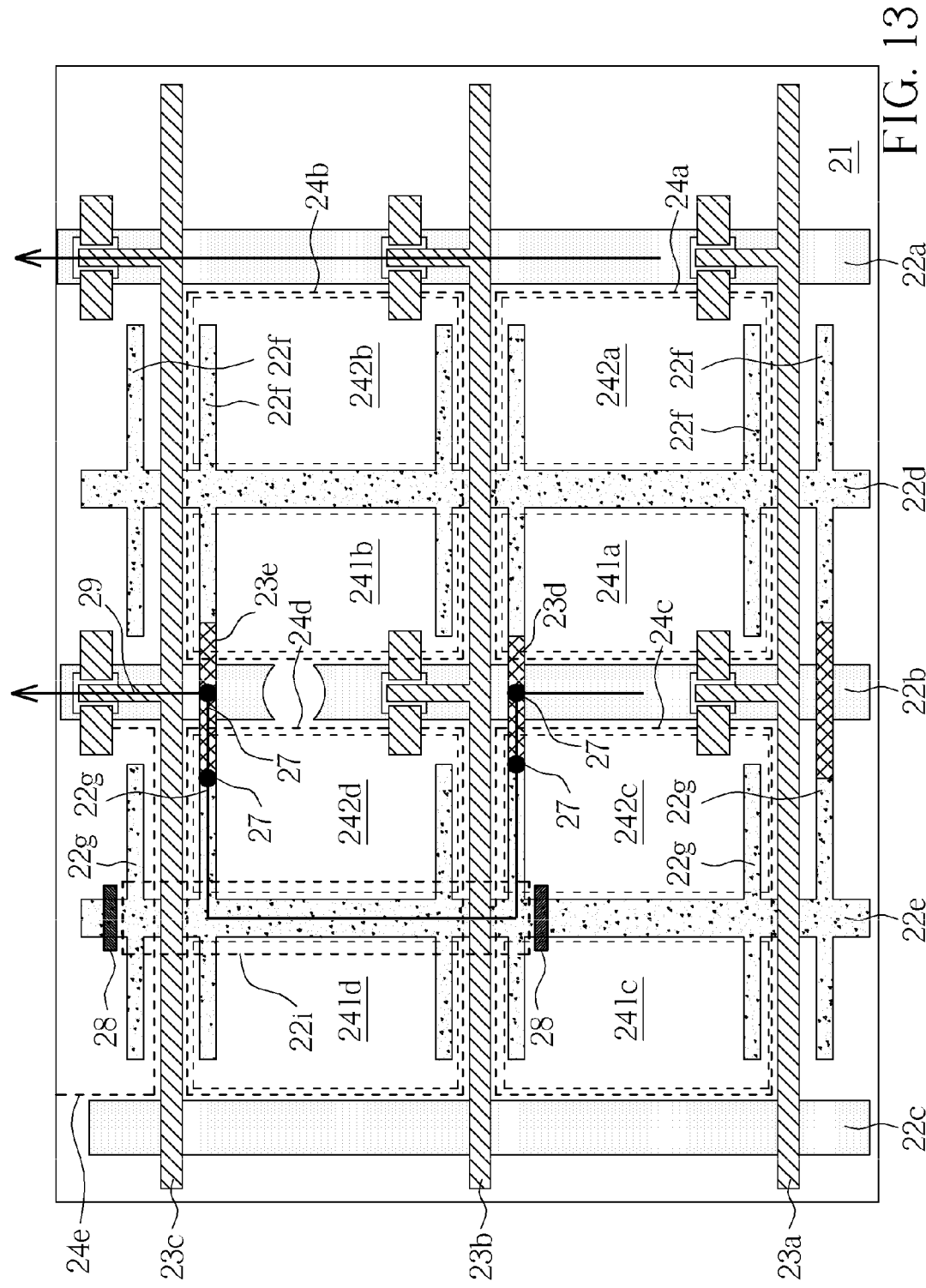
FIG. 13 is a schematic diagram illustrating a method of repairing the disconnected scan lines of the third preferred embodiment of the display panel having a repair structure of the present invention.

With reference to FIG. 10 and FIG. 11, FIG. 10 and FIG. 11 are schematic diagrams illustrating the methods of repairing the disconnected scan lines of the first preferred embodiment of the display panel having a repair structure of the present invention, FIG. 10 is a top view diagram, and FIG. 11 is a cross-sectional schematic diagram along the lines C1C1', C2C2', C3C3' illustrated in FIG. 10. The method of repairing disconnected scan line illustrated in FIG. 10 and FIG. 11 is carried out to repair the disconnected scan line of the first preferred embodiment of the display panel having a repair structure illustrated in FIG. 2. As illustrated in FIG. 10 and FIG. 11, the steps of repairing the disconnected scan line include performing a welding process and performing a cutting process. For example, if the disconnected line occurs to the second scan line 22*b* between the second pixel region 24*d* and the fourth pixel region 24*d*, the following steps can be performed to repair the disconnected scan line. A welding process such as laser welding process is performed to form a plurality of welding structures 27, and each of the welding structures 27 is served as a connector to electrically connect the second common line branch 22*g* disposed in the third pixel region 24*c* and one terminal of the first floating repair line 23*d*, and to electrically connect the second common line branch 22*g* disposed in the fourth pixel region 24*d* and one terminal of the second floating repair line 23*e*; and a cutting process such as laser cutting process is performed to form a plurality of cutting openings 28, and each of the cutting openings 28 is served as a open point to achieve the goal of disconnecting the second common line 22*e* disposed in both the third pixel region 24*c* and the fifth pixel region 24*e* so that the disconnected second common line 22*e* forms a second floating common line 22*i*. As illustrated in FIG. 11, the first floating repair line 23*d* is vertically welded to the second scan line 22*b* and to the second common line branch 22*g* respectively while the laser irradiation is applied so that a new signal transmission route is formed. Similarly, the second floating repair line 23*e* is vertically welded to the second scan line 22*b* and to the second common line branch 22*g* respectively so that a new signal transmission route is formed. In addition, as illustrated in FIG. 10, the two opposite terminals of the second common line 22*e* is cut in the vertical projection direction after laser irradiation so as to form a second floating common line 22*i*. Accordingly, the first floating repair line 23*d*, the second floating repair line 22*i* and the second floating repair line 23*e* form a substitutional signal transmission route 29 for the second scan line 22*b* to achieve the goal of repairing the disconnected scan lines. It should be noted that the sequence of the steps of the aforementioned welding process and the cutting process can be adjusted as required and has no particular limitation. With reference to FIG. 12 and FIG. 13, FIG. 12 is a schematic diagram illustrating a method of repairing the disconnected scan lines of the second preferred embodiment of the display panel having a repair structure of the present invention, and FIG. 13 is a schematic diagram illustrating a method of repairing the disconnected scan lines of the third preferred embodiment of the display panel having a repair structure of the present invention. The method illustrated in FIG. 12 is carried out to repair the disconnected scan line of the second preferred embodiment of the pixel electrode of the display panel having a repair structure illustrated in FIG. 4, and the method illustrated in FIG. 13 is carried out to repair the disconnected scan line of the third preferred embodiment of the pixel electrode of the display panel having a repair structure illustrated in FIG. 5. As illustrated in FIG. 12 and FIG. 13, the steps of repairing the disconnected data lines of the aforementioned two preferred embodiments include a welding process and a cutting process so that a substitutional signal transmission route 29 is formed for the second scan line 22*b* to achieve the goal of repairing the disconnected scan lines. Meanwhile, the difference is that the arrangements of the pixel electrodes of the embodiments are substantially different, whereas the methods of repairing the disconnected scan lines of the first preferred embodiment, the second preferred embodiment and the third preferred embodiment are substantially identical.

Figure 14:
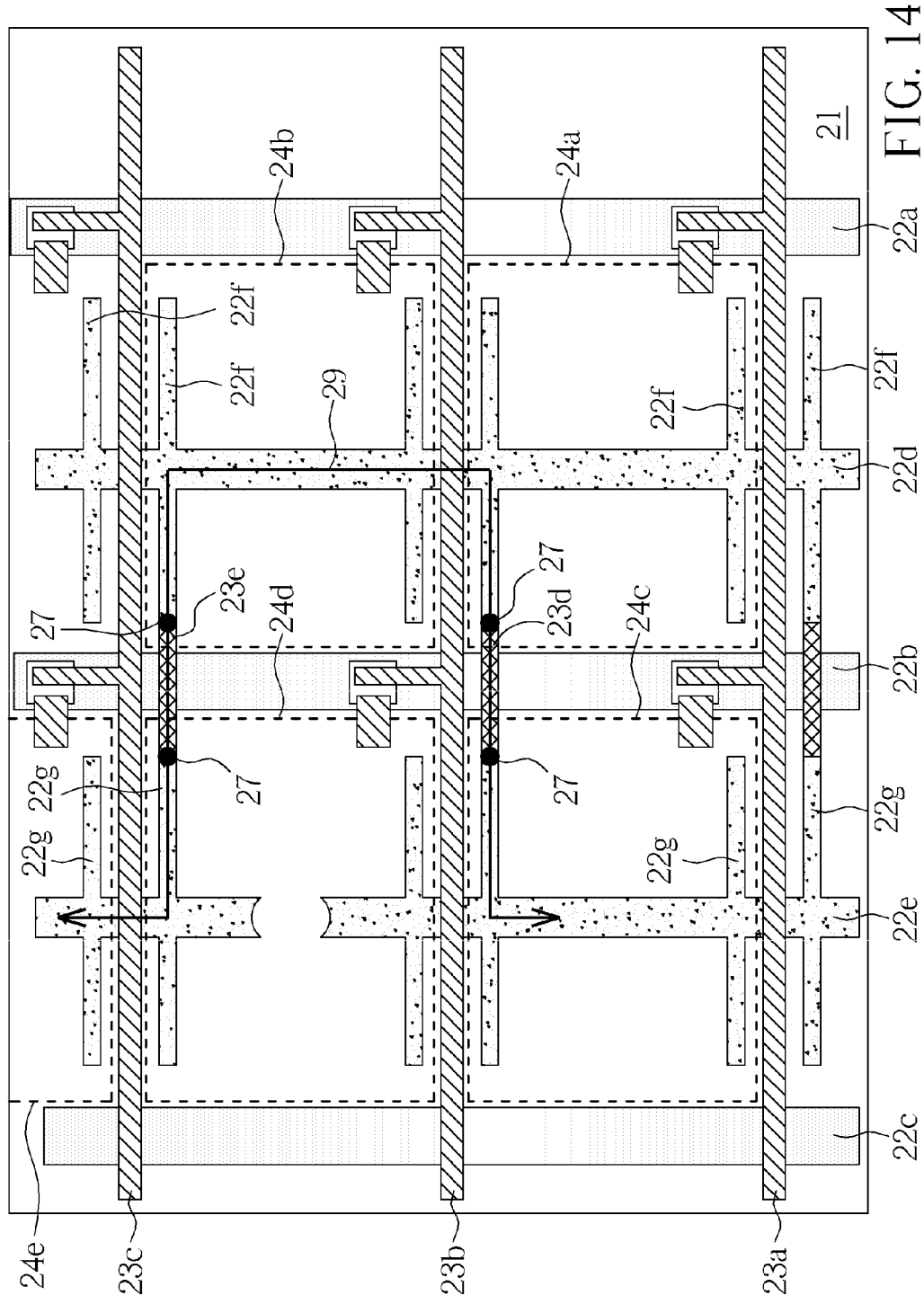
FIG. 14 is a schematic diagram illustrating a method of repairing the disconnected common lines of the first preferred embodiment of the display panel having a repair structure of the present invention.
Figure 15:
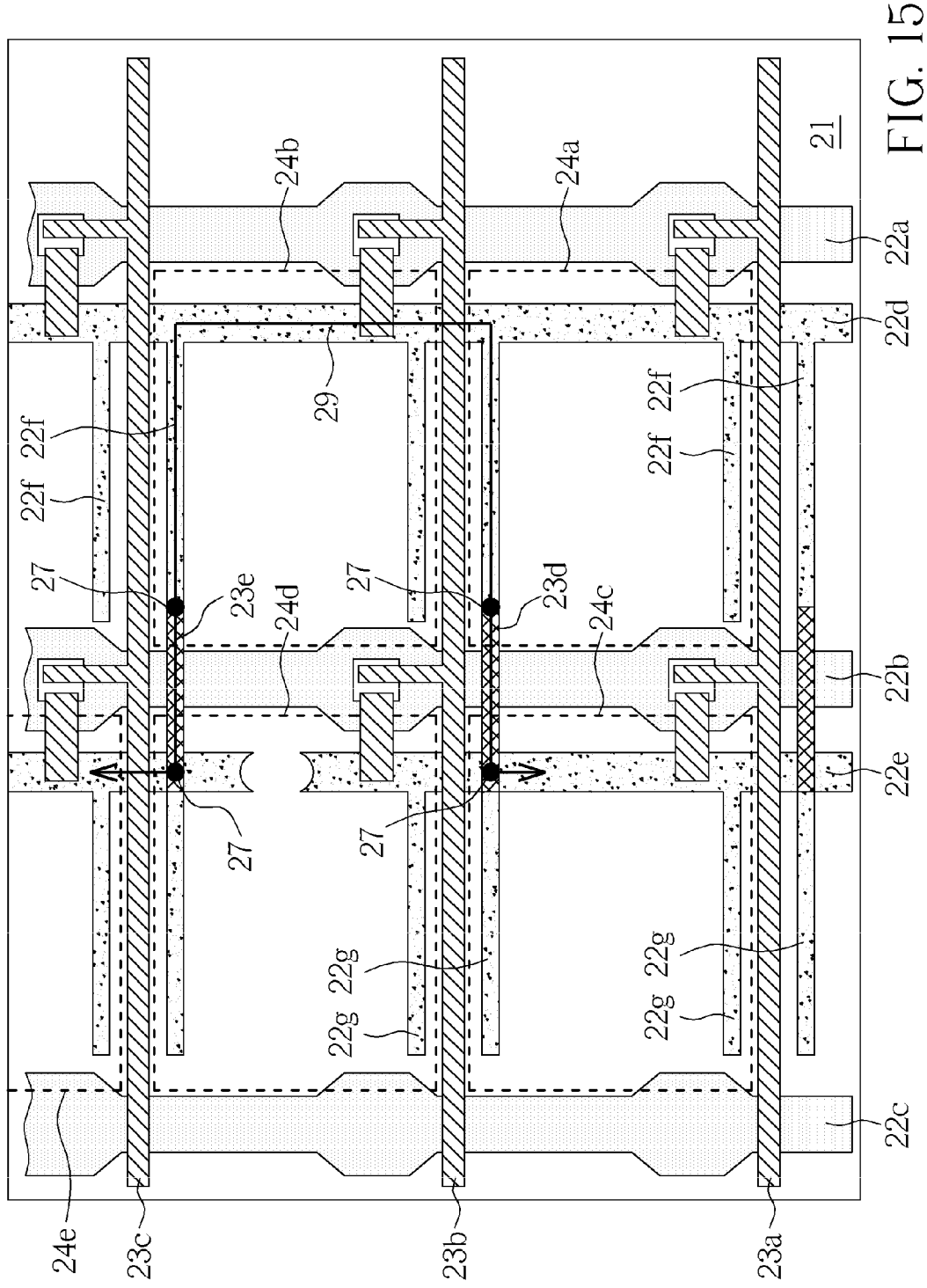
FIG. 15 is a schematic diagram illustrating a method of repairing the disconnected common lines of the second preferred embodiment of the display panel having a repair structure of the present invention.
Figure 16:
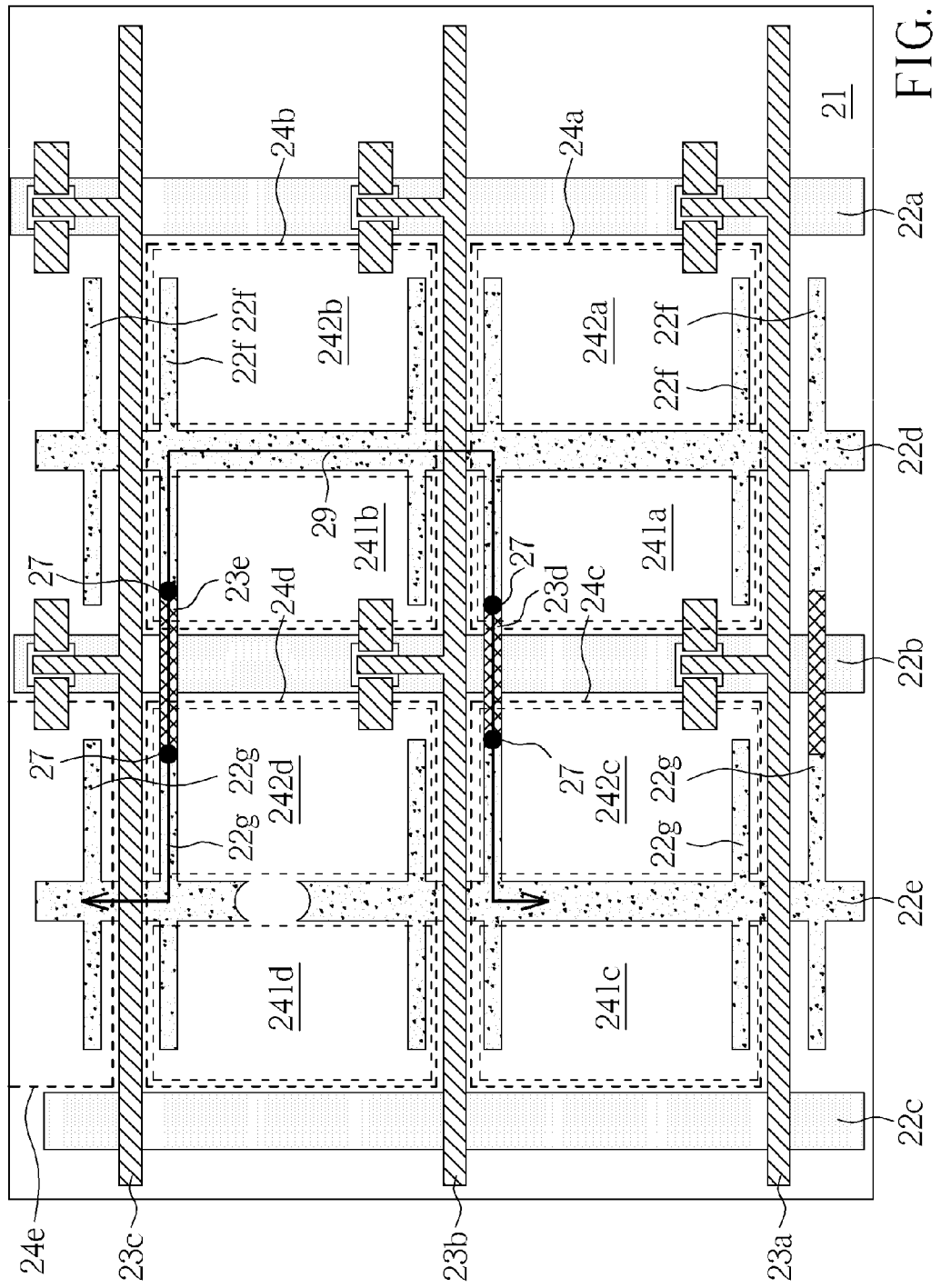
FIG. 16 is a schematic diagram illustrating a method of repairing the disconnected common lines of the third preferred embodiment of the display panel having a repair structure of the present invention.

With reference to FIG. 14, FIG. 14 is a schematic diagram illustrating a method of repairing the disconnected common lines of the first preferred embodiment of the display panel having a repair structure of the present invention, and FIG. 14 illustrates the steps of repairing the disconnected common line of the first preferred embodiment of the display panel having a repair structure illustrated in FIG. 2. As illustrated in FIG. 14, the steps of repairing the disconnected common lines include performing a welding process. For example, if the disconnected line occurs to the second common line 22*e* disposed in the fourth pixel region 24*d*, the following steps can be performed to repair the disconnected common line. A welding process such as laser process is performed to form a plurality of welding structures 27, each of the welding structures 27 is served as a connector so that the first common line branch 22*f* disposed in the first pixel region 24*a*, the second common line branch 22*g* disposed in the third pixel region 24*c* and the first floating repair line 23*d* are electrically connected to each other, and the first common line branch 22*f* disposed in the second pixel region 24*b*, the second common line branch 22*g* disposed in the fourth pixel region 24*d* and the second floating repair line 23*e* are electrically connected to each other. Consequently, the first floating repair line 23*d*, the first common line 22*d* and the second floating repair line 23*e* form a substitutional signal transmission route 29 for the second common line 22*e* to achieve the goal of repairing the disconnected common lines. With reference to FIG. 15 and FIG. 16, FIG. 15 is a schematic diagram illustrating a method of repairing the disconnected common lines of the second preferred embodiment of the display panel having a repair structure of the present invention, and FIG. 16 is a schematic diagram illustrating a method of repairing the disconnected common lines of the third preferred embodiment of the display panel having a repair structure of the present invention. FIG. 15 illustrates the steps of repairing the disconnected common line of the second preferred embodiment of the display panel having a repair structure illustrated in FIG. 4, and FIG. 16 illustrates the steps of repairing the disconnected common line of the third preferred embodiment of the display panel having a repair structure illustrated in FIG. 5. As illustrated in FIG. 15 and FIG. 16, the steps of repairing the disconnected common lines of the aforementioned two preferred embodiments include performing a welding process to form a plurality of welding structures 27, and each of the welding structures 27 is served as a connector to electrically connect the first floating repair line, first floating repair line 23*d*, the first common lines 22*d* and the second floating repair line 23*e* to each other so as to form a new signal transmission route. After that, the first floating repair line 23*d*, the first common line 22*d* and the second floating repair line 23*e* form a substitutional signal transmission route 29 so as to achieve the goal of repairing the disconnected common line. Meanwhile, it is therefore that the arrangements of the pixel electrodes of the embodiments are substantially different, whereas the methods of repairing the disconnected common lines of the first preferred embodiment, the second preferred embodiment and the third preferred embodiment are substantially identical.

From aforementioned description we know, the repair lines of the display panel having a repair structure of the present invention can be electrically connected to the common line branches or scan lines respectively as required. Meanwhile, the present invention has the foregoing merits and thereby disposes the floating repair lines inside the display panel so as to achieve the goal of repairing the broken scan lines, broken data lines and broken common lines inside the display panel.

In summary, the display panel having a repair structure of the present invention has advantages as follows:

The display panel having a repair structure of present invention integrates the floating repair lines into two adjacent pixel structures so that the repair line structure of the present invention overcomes the disadvantages of the conventional longer repair lines and the larger space peripherally occupied by the external repair lines inside the display panel. Consequently, the display panel having a repair structure of the present invention obviously minimizes the space occupied by the repair structure and economizes the cost of forming the repair lines.

The display panel having a repair structure of the present invention can integrate the forming process of the repair structure into the pixel region of the display panel so that the broken scan lines, the broken data lines and the broken common lines inside the display panel can be repaired as required. Meanwhile, the repair structure of the display panel of the present invention overcomes the obstacle of the conventional display panel repair line technique which can only repair the disconnected data lines with defects. In another words, the display panel having a repair structure of the present invention can provide a multifunctional repair function.

The display panel having a repair structure of the present invention can overcome the inevitable signal delay phenomena generated in the conventional display panel which adopts the external repair line technique and eliminate the disadvantage of electrical instability, such as signal decay and signal distortion caused due to the higher impedance of the repair lines. As a result, the display panel having a repair structure of the present invention can provide a new stable signal transmission route.

Those skilled in the art will readily observe that numerous modifications and alterations of the device and method may be made while retaining the teachings of the invention.

What is claimed is:

1. A display panel having a repair structure, comprising:
a substrate;
a first metal layer disposed on the substrate, the first metal layer comprising a first scan line, a second scan line, a third scan line and a plurality of common lines, wherein the common lines comprise a first common line and a second common line;
an insulating layer covering the first metal layer disposed on the substrate; and
a second metal layer disposed on the insulating layer, the second metal layer comprising a first data line, a second data line, a third data line and a first repair line, the first data line, the second data line and the third data line being arranged substantially parallel to each other and substantially perpendicular to the first scan line, the second scan line and the third scan line for defining a plurality of pixel regions arranged in an array-shaped arrangement, the pixel regions comprising a first pixel region, a second pixel region, a third pixel region and a fourth pixel region, wherein the first common line penetrates through the first pixel region and the second pixel region, and partially overlaps with the first data line, the second data line and the third data line, the second common line penetrates through the third pixel region and the fourth pixel region, and partially overlaps with the first data line, the second data line and the third data line, the first repair line bridges across the first pixel region and the third pixel region, and partially overlaps with the second scan line, the first repair line partially overlaps with the first common line disposed in the first pixel region and partially overlaps with the second common line disposed in the third pixel region respectively, the first repair line is floating prior to a repair process, and the first repair line is connected to at least one of the common lines subsequent to the repair process.

2. The display panel having a repair structure of claim 1, wherein each of the common lines penetrates through central parts of the pixel regions.

3. The display panel having a repair structure of claim 2, wherein each of the common lines comprises a plurality of common line branches, and the common line branches and each of the common lines form an H-shaped structure in each of the pixel regions.

4. The display panel having a repair structure of claim 1, wherein each of the common lines penetrates through edge parts of the pixel regions.

5. The display panel having a repair structure of claim 4, wherein each of the common lines comprises a plurality common line branches, and the common line branches and each of the common lines form a U-shaped structure in each of the pixel regions.

* * * * *